(12) United States Patent
Hoffman

(10) Patent No.: US 6,603,183 B1
(45) Date of Patent: Aug. 5, 2003

(54) QUICK SEALING GLASS-LIDDED PACKAGE

(75) Inventor: Paul Robert Hoffman, Chandler, AZ (US)

(73) Assignee: Amkor Technology, Inc., Chandler, AZ (US)

(*) Notice: Subject to any disclaimer, the term of this patent is extended or adjusted under 35 U.S.C. 154(b) by 0 days.

(21) Appl. No.: 09/946,750

(22) Filed: Sep. 4, 2001

(51) Int. Cl.$^7$ .......................................... H01L 31/0203
(52) U.S. Cl. ................. 257/434; 257/433; 257/432; 257/780; 257/704; 257/731; 257/783; 257/784
(58) Field of Search ................. 257/432, 433, 257/434, 680, 678, 753, 704, 731, 749, 784, 780, 787, 257, 783

(56) References Cited

U.S. PATENT DOCUMENTS

| | | | |
|---|---|---|---|
| 5,122,861 A | 6/1992 | Tamura et al. ................. 357/74 |
| 5,615,052 A | * 3/1997 | Doggett ....................... 359/811 |
| 5,753,857 A | 5/1998 | Choi .......................... 174/52.4 |
| 5,865,935 A | * 2/1999 | Ozimek et al. .......... 156/303.1 |
| 6,117,705 A | * 9/2000 | Glenn et al. ................. 438/106 |
| 6,144,107 A | * 11/2000 | Narita ......................... 257/100 |
| 6,185,180 B1 | * 2/2001 | Morishita .................... 369/244 |

* cited by examiner

Primary Examiner—David L. Talbott
Assistant Examiner—Luan Thai
(74) Attorney, Agent, or Firm—Gunnison, McKay & Hodgson, L.L.P.; Serge J. Hodgson

(57) ABSTRACT

An image sensor package includes a substrate and an image sensor mounted to the substrate. Bond pads of the image sensor are wirebonded to interior traces on the substrate by bond wires. An encapsulant encloses the bond wires, the encapsulant being formed of a first optically curable material that has been cured. A lid adhesive mounts a lid to the substrate, the lid adhesive being formed of a second optically curable material that has been cured. During fabrication, the first and second optically curable materials are cured rapidly without heating to form the encapsulant and the lid adhesive, respectively, thus minimizing the fabrication cost of the image sensor package.

31 Claims, 5 Drawing Sheets

QUICK SEALING GLASS-LIDDED PACKAGE

BACKGROUND OF THE INVENTION

1. Field of the Invention

The present invention relates generally to the packaging of electronic components. More particularly, the present invention relates to an electronic component package.

2. Description of the Related Art

Image sensors are well known to those of skill in the art. An image sensor included an active area, which was responsive to electromagnetic radiation. The image sensor was incorporated into an image sensor package, which protected the image sensor from dust and moisture.

In one image sensor package, the image sensor was located within an enclosure, which included a window. Electromagnetic radiation passed through the window and struck the active area of the image sensor, which responded to the electromagnetic radiation. The enclosure also served to protect the image sensor from dust and moisture. Although the enclosure around the image sensor was reliable and effective, fabrication of the enclosure was relatively complex, time-consuming, and thus expensive.

SUMMARY OF THE INVENTION

In accordance with one embodiment of the present invention, a method of forming an image sensor package includes coupling an image sensor, i.e., an electronic component, to a substrate. Bond pads of the image sensor are electrically coupled to interior traces on the substrate with bond wires. A first optically curable material is applied to enclose the bond wires. A second optically curable material is applied between a lid and the substrate. The first and second optically curable materials are cured with a first electromagnetic radiation such as ultraviolet radiation. The substrate, lid, and cured second optically curable material form a low cost enclosure around the image sensor.

In one embodiment, the first and second optically curable materials are optically entirely curable materials. In accordance with this embodiment, the first and second optically curable materials are cured immediately as a result of being irradiated with the first electromagnetic radiation. More particularly, the first and second optically curable materials are entirely cured while being irradiated with the first electromagnetic radiation.

In an alternative embodiment, the first and second optically curable materials are optically activated materials. In accordance with this embodiment, the first and second optically curable materials cure over a period of time as a result of being irradiated with the first electromagnetic radiation. More particularly, the first and second optically curable materials cure initiate while being irradiated with the first electromagnetic radiation and then entirely cure over a period of time without further irradiation.

In one embodiment, after being cure initiated, the first and second optically curable materials entirely cure at room temperature, i.e., without heating. Alternatively, after being cure initiated, the first and second optically curable materials entirely cure at elevated temperature, e.g., are heated to reduce the curing time.

Advantageously, the first and second optically curable materials are cured rapidly, e.g., in a matter of seconds. This is in stark contrast to conventional thermally curable materials, which often had a cure time of several hours. By curing the first and second optically curable materials rapidly, the time required to fabricate the image sensor package is minimized. This, in turn, minimizes the fabrication cost of the image sensor package.

In one embodiment, the first and second optically curable materials are cured without heating the image sensor package to any appreciable extent. This is in stark contrast to conventional thermally curable materials, which required heating for several hours.

Accordingly, use of the first and second optically curable materials is well suited for applications in which it is important to keep the image sensor and any other temperature sensitive components of the image sensor package at low temperature, for example, to prevent degradation or damage to any color filters and/or other temperature sensitive materials of the image sensor.

Further, since the first and second optically curable materials are cured without heating, the requirement for cure ovens, which were necessary to cure conventional thermally curable materials, is eliminated further minimizing the fabrication cost of the image sensor package.

Also in accordance with one embodiment of the present invention, an image sensor package includes a substrate and an image sensor coupled to the substrate. An interior trace is coupled to the substrate. A bond wire electrically couples a bond pad of the image sensor to the interior trace. An encapsulant encloses the bond wire, the encapsulant being formed of a first optically curable material that has been cured.

The image sensor package further includes a lid. A lid adhesive couples the lid to the substrate, the lid adhesive being formed of a second optically curable material that has been cured.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
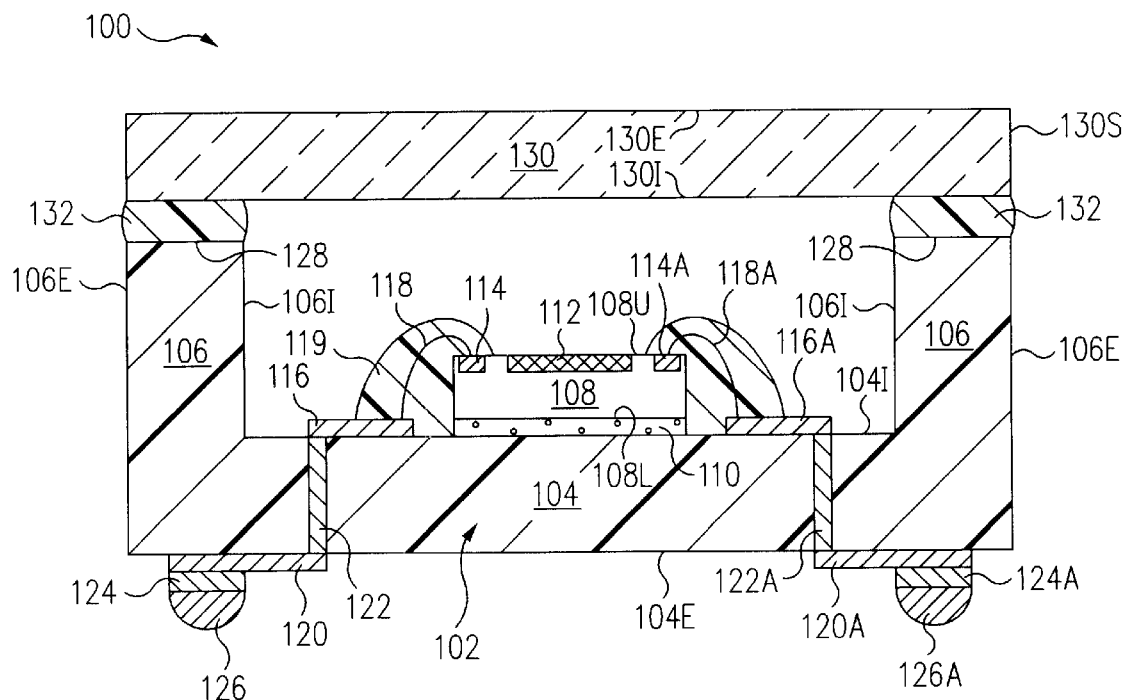
FIG. 1 is a cross-sectional view of an image sensor package in accordance with one embodiment of the present invention.

In accordance with one embodiment of the present invention, a first optically curable material 402 (FIG. 5) is applied to enclose bond wires 118. A second optically curable material 502 is applied between a lid 130 and a substrate 102. First and second optically curable materials 402, 502 are cured through lid 130 with an ultraviolet radiation 504.

In one embodiment, first and second optically curable materials 402, 502 are optically entirely curable materials. In accordance with this embodiment, first and second optically curable materials 402, 502 are cured immediately as a result of being irradiated with ultraviolet radiation 504. More particularly, first and second optically curable materials 402, 502 are entirely cured while being irradiated with ultraviolet radiation 504.

In an alternative embodiment, first and second optically curable materials 402, 502 are optically activated materials. In accordance with this embodiment, first and second optically curable materials 402, 502 cure over a period of time as a result of being irradiated with ultraviolet radiation 504. More particularly, first and second optically curable materials 402, 502 cure initiate while being irradiated with ultraviolet radiation 504 and then entirely cure over a period of time without further irradiation.

After being cure initiated, first and second optically curable materials 402, 502 entirely cure at room temperature, i.e., without heating. Alternatively, after being cure initiated, first and second optically curable materials 402, 502 entirely cure at elevated temperature, e.g., are heated to reduce the curing time.

Advantageously, first and second optically curable materials 402, 502 are cured rapidly, e.g., in a matter of seconds. This is in stark contrast to conventional thermally curable materials, which often had a cure time of several hours. By curing first and second optically curable materials 402, 502 rapidly, the time required to fabricate image sensor package 100 is minimized. This, in turn, minimizes the fabrication cost of the image sensor package 100.

In one embodiment, first and second optically curable materials 402, 502 are cured without heating image sensor package 100 to any appreciable extent. This is in stark contrast to conventional thermally curable materials, which required heating for several hours.

Accordingly, use of first and second optically curable materials 402, 502 is well suited for applications in which it is important to keep an image sensor 108 and any other temperature sensitive components of image sensor package 100 at low temperature, for example, to prevent degradation or damage to any color filters and/or other temperature sensitive materials of image sensor 108.

Further, since first and second optically curable materials 402, 502 are cured without heating, the requirement for cure ovens, which were necessary to cure conventional thermally curable materials, is eliminated further minimizing the fabrication cost of image sensor package 100.

More particularly, FIG. 1 is a cross-sectional view of an image sensor package 100 in accordance with one embodiment of the present invention. Image sensor package 100 is used in a wide variety of applications, e.g., cameras and cellular telephones.

Image sensor package 100 includes a substrate 102, e.g., formed of ceramic, pre-molded plastic on leadframe or laminate. Substrate 102 is a rectangular cup shape enclosure and includes a base 104 and a sidewall 106. Sidewall 106 is formed around a periphery of base 104 and extended upwards, e.g., in a first direction, from base 104. In this embodiment, base 104 and sidewall 106 are integral, i.e., are a single piece and not a plurality of separate pieces connected together.

Base 104 includes an interior, e.g., first, surface 104I and an exterior, e.g., second, surface 104E. Mounted, sometimes called die attached, to interior surface 104I is an image sensor 108, sometimes called an electronic component. More particularly, a lower, e.g., first, surface 108L of image sensor 108 is mounted to interior surface 104I with an adhesive 110, sometimes called a die attach adhesive.

Image sensor 108 further includes an upper, e.g., second, surface 108U. An active area 112 and bond pads 114 of image sensor 108 are on upper surface 108U. Although bond pads 114 are illustrated as being on both sides of image sensor 108, in alternative embodiments, bond pads 114 are formed only along a single side of image sensor 108. In this embodiment, interior surface 104I, lower surface 108L, and upper surface 108U are parallel to one another.

Generally, active area 112 of image sensor 108 is responsive to electromagnetic radiation, as is well known to those of skill in the art. For example, active area 112 is responsive to infrared radiation, ultraviolet radiation, and/or visible light. Illustratively, image sensor 108 is a CMOS image sensor device, a charge coupled device (CCD), a pyroelectric device, or an erasable programmable read-only memory device (EPROM) although other image sensors are used in other embodiments.

Formed on interior surface 104I of substrate 102 are a plurality of electrically conductive interior traces 116, which include a first interior trace 116A. Interior traces 116 are electrically connected to bond pads 114 by bond wires 118. To illustrate, a first bond pad 114A of the plurality of bond pads 114 is electrically connected to interior trace 116A by a first bond wire 118A of the plurality of bond wires 118.

Bond wires 118 are enclosed within an encapsulant 119. Encapsulant 119 also encloses bond pads 114 and at least a portion of interior traces 116 in this embodiment. Encapsulant 119 protects bond wires 118, e.g., from shorting and moisture. Encapsulant 119 also contacts the periphery of upper surface 108U of image sensor 108. However, encapsulant 119 does not cover and leaves exposed active area 112.

In one embodiment, encapsulant 119 is a cured optically curable material, e.g., is a cured optically curable sealant, adhesive, or encapsulant. Generally, an optically curable material: (1) is a viscous material, i.e., a material that has the ability to flow and/or wet; and (2) cures, i.e., sets-up, gels, solidifies or otherwise changes, as a result of being irradiated with a particular electromagnetic radiation, i.e., electromagnetic radiation having a particular wavelength or being within a particular range of wavelengths such as, for example, ultraviolet radiation.

Examples of optically curable materials include optically entirely curable materials and optically activated materials. An optically entirely curable material cures immediately as a result of being irradiated with a particular electromagnetic radiation. More particularly, an optically entirely curable material entirely cures while being irradiated with a particular electromagnetic radiation.

On the other hand, an optically activated material cures over a period of time as a result of being irradiated with a particular electromagnetic radiation. More particularly, an optically activated material cure initiates while being irradiated with a particular electromagnetic radiation and then entirely cures over a period of time without further irradiation.

In one embodiment, cure initiates means that a chemical reaction that causes the optically activated material to become cured is initiated. After being cure initiated, optically activated materials entirely cure at room temperature, i.e., without heating. Alternatively, after being cure initiated, optically activated materials entirely cure at elevated temperature, e.g., are heated to reduce the curing time.

Illustratively, encapsulant 119 is an optically curable material that that has been cured as a result of being irradiated with ultraviolet radiation (UV), sometimes called a cured UV curable material.

In an alternative embodiment, encapsulant 119 is a cured thermally curable material, e.g., is a sealant, adhesive, or encapsulant that has been cured by heating. Generally, a thermally curable material is a viscous material that cures upon being heated. In yet another alternative embodiment, encapsulant 119 is not formed.

Formed on exterior surface 104E of substrate 102 are a plurality of electrically conductive exterior traces 120, which include a first exterior trace 120A. Extending through base 104 from exterior surface 104E to interior surface 104I are a plurality of electrically conductive vias 122, which include a first via 122A. Exterior traces 120 are electrically connected to interior traces 116 by vias 122. To illustrate, exterior trace 120A is electrically connected to interior trace 116A by via 122A.

Formed on exterior traces 120 are electrically conductive pads 124, which include a first pad 124A. Formed on pads 124 are electrically conductive interconnection balls 126, e.g., solder. To illustrate, pad 124A is formed on exterior trace 120A. A first interconnection ball 126A of the plurality of interconnection balls 126 is formed on pad 124A. Interconnection balls 126 are used to connect image sensor package 100 to a larger substrate such as a printed circuit mother board.

In one embodiment, interior traces 116 and/or exterior traces 120 are covered with a dielectric protective layer, e.g., solder mask, as those of skill in the art will understand.

As set forth above, an electrically conductive pathway between bond pad 114A and interconnection ball 126A is formed by bond wire 118A, interior trace 116A, via 122A, exterior trace 120A, and pad 124A. The other bond pads 114, bond wires 118, interior traces 116, vias 122, exterior traces 120, pads 124 and interconnection balls 126 are electrically connected to one another in a similar fashion and so are not discussed further to avoid detracting from the principals of the invention.

Although a particular electrically conductive pathway between bond pad 114A and interconnection ball 126A is described above, other electrically conductive pathways can be formed. For example, contact metallizations can be formed between the various electrical conductors, e.g., between bond pads 114 and bond wires 118, between bond wires 118 and interior traces 116, between exterior traces 120 and pads 124, and/or between pads 124 and interconnection balls 126. Alternatively, pads 124 are not formed and interconnection balls 126 are formed directly on exterior traces 120.

As yet another alternative, interconnection balls 126 are distributed in an array format to form a ball grid array (BGA) type package. Alternatively, interconnection balls 126 (or interconnection balls 126 and pads 124) are not formed, e.g., to form a metal land grid array (LGA) type package. In yet another alternative, a leadless chip carrier (LCC) type package is formed. BGA, LGA and LCC type packages are well known to those of skill in the art. Other electrically conductive pathway modifications will be obvious to those of skill in the art.

Sidewall 106 of substrate 102 includes an interior surface 106I and an exterior surface 106E. In this embodiment, interior surface 106I is parallel to exterior surface 106E. Further, interior surface 106I and exterior surface 106E are perpendicular to interior surface 104I and exterior surface 104E, which are parallel to one another. Although various structures may be described as being parallel or perpendicular, it is understood that the structures may not be exactly parallel or perpendicular but only substantially parallel or perpendicular to within accepted manufacturing tolerances.

Extending between exterior surface 106E and interior surface 106I of sidewall 106 is a lid mounting surface 128 of sidewall 106 of substrate 102. Lid mounting surface 128 is parallel to interior surface 104I and exterior surface 104E of base 104 of substrate 102. Lid mounting surface 128 is annular when viewed from above, e.g., is a rectangular annulus.

Mounted to substrate 102 is a lid 130. In this embodiment, lid 130 is planar, i.e., is a flat piece. Lid 130 includes an interior, e.g., first, surface 130I and an exterior, e.g., second, surface 130E. A side 130S of lid 130 extends between interior surface 130I and exterior surface 130E. Exterior surface 130E is exposed to the ambient environment. Although lid 130 as a flat piece is set forth above and illustrated in FIG. 1, in an alternative embodiment, lid 130 has a different shape, e.g., is curved, cap shaped or otherwise has a non-planar shape.

Lid 130 is mounted to lid mounting surface 128 of substrate 102 by a lid adhesive 132. More particularly, lid adhesive 132 bonds the periphery of interior surface 130I of lid 130 adjacent side 130S to mounting surface 128 of substrate 102.

Further, lid adhesive 132 forms a seal between lid 130 and substrate 102, which protects image sensor 108 from environmental degradation, e.g., from dust and moisture. More particularly, substrate 102, lid 130 and lid adhesive 132 form an enclosure around image sensor 108 and protect image sensor 108 from the ambient environment.

In one embodiment, lid adhesive 132 is a cured optically curable material, e.g., is a cured optically curable sealant, adhesive, or encapsulant. Illustratively, lid adhesive 132 is an optically curable material that has been cured as a result of being irradiated with ultraviolet radiation, i.e., is a cured UV curable material. For example, lid adhesive 132 is formed of the same type of optically curable material as encapsulant 119.

In an alternative embodiment, lid adhesive 132 is a cured thermally curable material, e.g., is a sealant, adhesive, or encapsulant that has been cured by heating.

In one embodiment, lid 130, sometimes called a window, is transparent to the electromagnetic radiation to which active area 112 of image sensor 108 is responsive. For example, lid 130 is a glass window such as a borosilicate glass window although lid 130 is formed of other materials such as plastic in other embodiments.

During use, electromagnetic radiation is directed at image sensor package 100 including image sensor 108. This electromagnetic radiation passes through lid 130 and strikes active area 112, which responds to the electromagnetic radiation as is well known to those of skill in the art.

However, in an alternative embodiment, active area 112 of image sensor 108 transmits electromagnetic radiation. For example, image sensor 108 is a light emitting diode (LED) micro-display. In accordance with this embodiment, electromagnetic radiation transmitted by active area 112 passes through lid 130 and emanates from image sensor package 100.

For simplicity, in the above and following discussions, active area 112 as a receiver of electromagnetic radiation is set forth. However, in light of this disclosure, those of skill in the art will recognize that generally active area 112 can be a receiver of electromagnetic radiation, a transmitter of electromagnetic radiation, or a transceiver, i.e., a transmitter and a receiver, of electromagnetic radiation.

In yet another alternative embodiment, image sensor 108 is formed without active area 112, i.e., image sensor 108, referred to as electronic component 108 in accordance with this embodiment, is not an image sensor but is a non-optical electronic component such as a standard integrated circuit chip.

In one embodiment, encapsulant 119 and/or lid adhesive 132 are a first optically curable material and a second optically curable material, respectively, that have been cured as a result of being irradiated with a first electromagnetic radiation, such as, for example, ultraviolet radiation. For example, encapsulant 119 is a cured optically entirely curable material or a cured optically activated material. Similarly, lid adhesive 132 is a cured optically entirely curable material or a cured optically activated material.

In accordance with this embodiment, lid 130 is transparent to the first electromagnetic radiation, e.g., ultraviolet radiation. As discussed further below, in one embodiment, encapsulant 119 and lid adhesive 132 are cured through lid 130 with the first electromagnetic radiation, i.e., are cured by passing the first electromagnetic radiation through lid 130.

In one particular embodiment, encapsulant 119 and lid adhesive 132 are optically curable materials that have been cured with ultraviolet radiation, e.g., a first electromagnetic radiation. Further, active area 112 is responsive to visible light, i.e., a second electromagnetic radiation. Lid 130 is transparent to both the first and second electromagnetic radiation, i.e., is transparent to both ultraviolet radiation and visible light.

Figure 2:
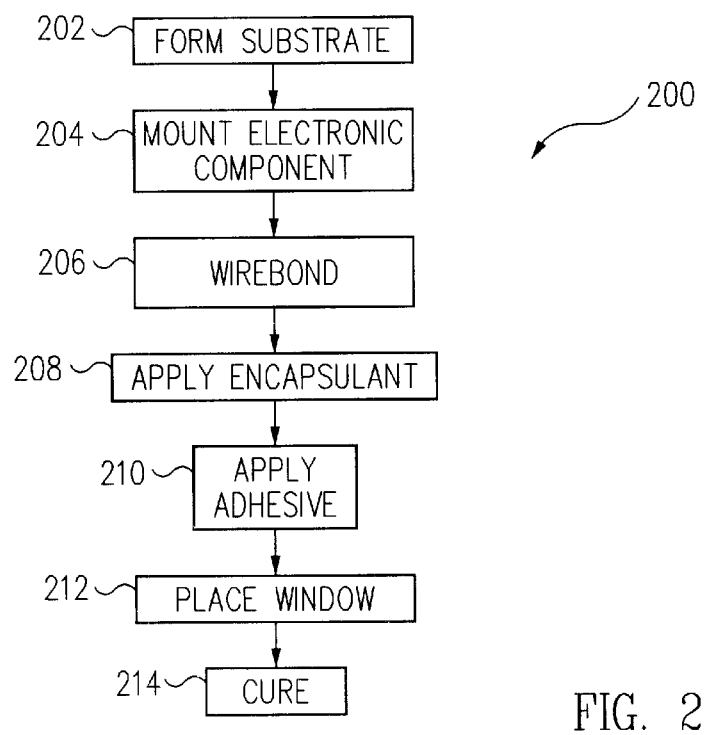
FIG. 2 is a block diagram illustrating operations in a process for manufacturing the image sensor package of FIG. 1 in accordance with one embodiment of the present invention.
Figure 3:
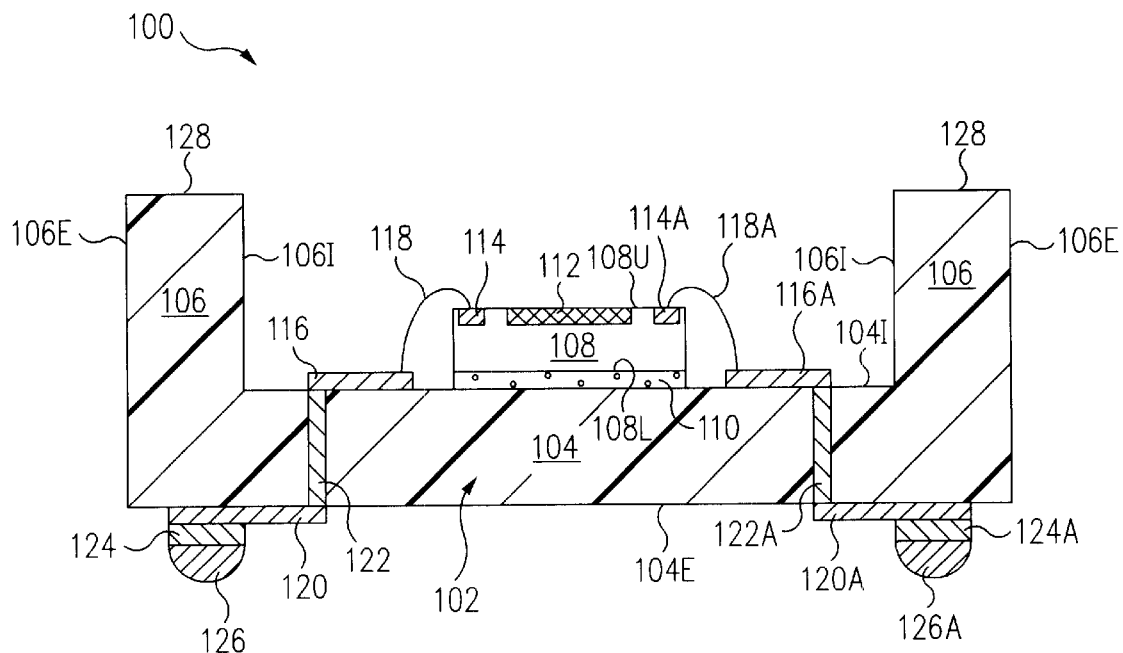
FIG. 3 is a cross-sectional view of the image sensor package of FIG. 1 during fabrication in accordance with one embodiment of the present invention.

FIG. 2 is a block diagram 200 illustrating operations in a process for manufacturing image sensor package 100 of FIG. 1 in accordance with one embodiment of the present invention. FIG. 3 is a cross-sectional view of image sensor package 100 of FIG. 1 during fabrication in accordance with one embodiment of the present invention.

Referring now to FIGS. 2 and 3 together, in a Form Substrate Operation 202, substrate 102 including interior traces 116, vias 122, exterior traces 120, pads 124 and interconnection balls 126 are formed. Substrate 102 is formed using any one of a number of techniques and the particular technique used to form substrate 102 is not essential to the present invention.

In a Mount Electronic Component Operation 204, lower surface 108L of image sensor 108 is attached to interior surface 104I of base 104 of substrate 102 by adhesive 110.

In a Wirebond Operation 206, bond pads 114 of image sensor 108 are electrically connected to interior traces 116 by bond wires 118 using a wirebonding tool. To illustrate, bond pad 114A is electrically connected to interior trace 116A by bond wire 118A. The other bond pads 114 are electrically connected to the other interior traces 116 by the other bond wires 118 in a similar manner.

Figure 4:
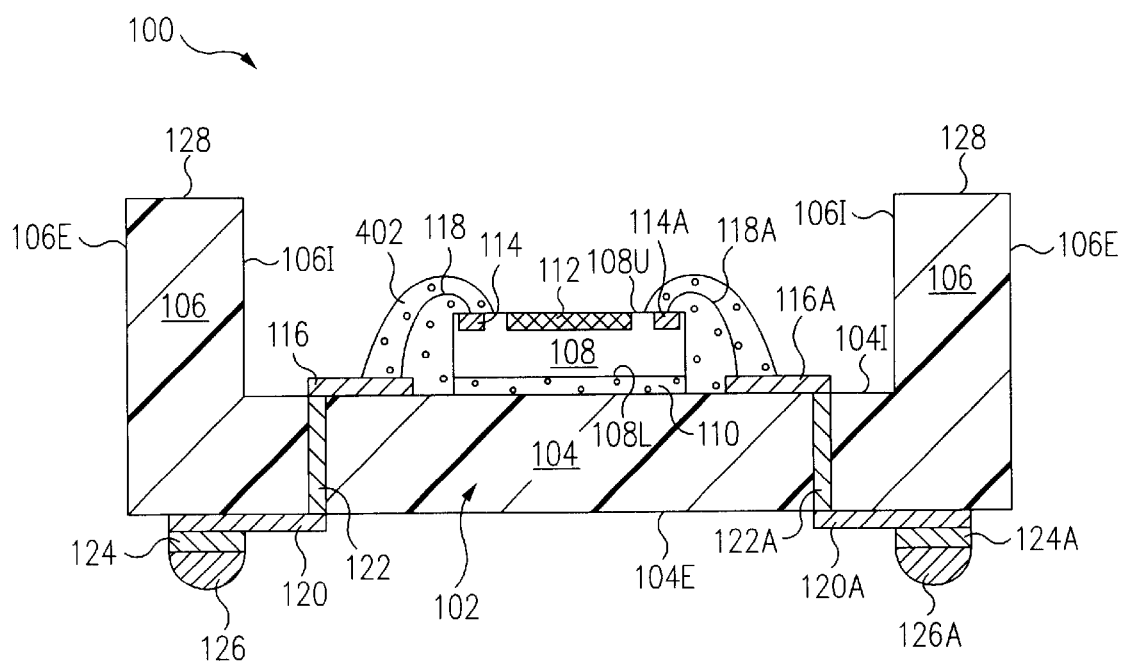
FIGS. 4 and 5 are cross-sectional views of the image sensor package of FIG. 3 at later stages during fabrication in accordance with various embodiments of the present invention.

FIG. 4 is a cross-sectional view of image sensor package 100 of FIG. 3 at a later stage during fabrication in accordance with one embodiment of the present invention. Referring now to FIGS. 2 and 4 together, in an Apply Encapsulant Operation 208, a first optically curable material 402, sometimes called encapsulant, is applied to enclose bond pads 114, bond wires 118 and at least a portion of interior traces 116. Illustratively, first optically curable material 402 is an optically entirely curable material or an optically activated material. First optically curable material 402 is applied, for example, with a needle dispenser.

Figure 5:
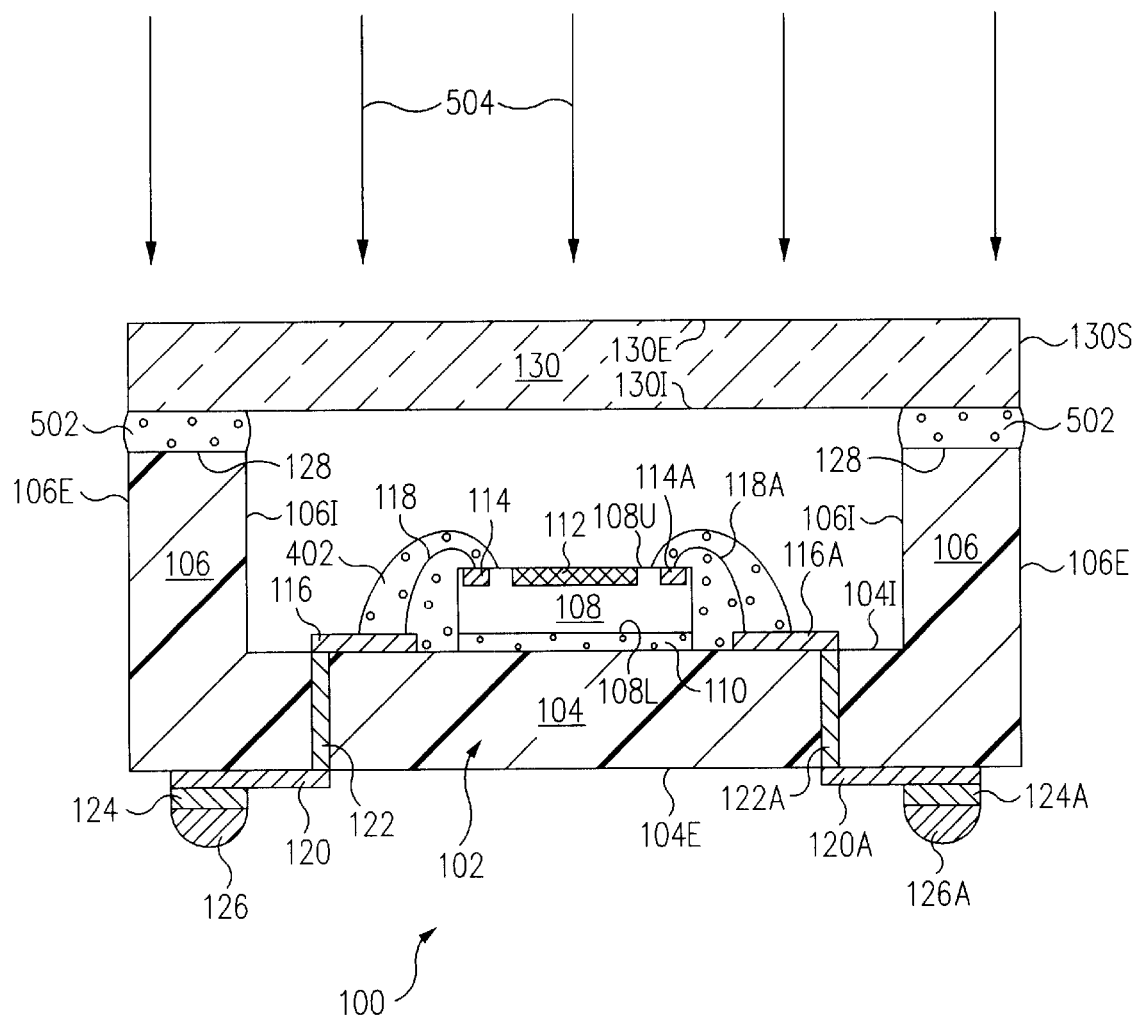

FIG. 5 is a cross-sectional view of image sensor package 100 of FIG. 4 at a later stage during fabrication in accordance with one embodiment of the present invention. Referring now to FIGS. 2 and 5 together, in an Apply Adhesive Operation 210, a second optically curable material 502, sometimes called adhesive, is applied to lid mounting surface 128 of substrate 102 or, alternatively, to the periphery of interior surface 130I of lid 130. Illustratively, second optically curable material 502 is an optically entirely curable material or an optically activated material.

In a Place Window Operation 212, lid 130 is aligned with substrate 102, e.g., with a mechanical or optical alignment system. More particularly, the periphery of interior surface 130I of lid 130 is aligned with lid mounting surface 128. Lid 130 is moved downwards to place lid 130 on substrate 102 such that second optically curable material 502 is squeezed between substrate 102 and lid 130. As a result, second optically curable material 502 is applied between lid 130 and substrate 102.

In a Cure Operation 214, first optically curable material 402 and second optically curable material 502 are cured with a first electromagnetic radiation 504, e.g., ultraviolet radiation, hereinafter referred to ultraviolet radiation 504 for simplicity of discussion. Generally, image sensor package 100 is irradiated with ultraviolet radiation 504. Ultraviolet radiation 504 passes through lid 130, which is transparent to ultraviolet radiation 504.

Referring now to FIGS. 1 and 5 together, after passing through lid 130, ultraviolet radiation 504 strikes first optically curable material 402 and second optically curable material 502. As a result, first optically curable material 402 and second optically curable material 502 (FIG. 5) are cured to form encapsulant 119 and lid adhesive 132 (FIG. 1).

In one embodiment, first and/or second optically curable materials 402, 502 are optically entirely curable materials. In accordance with this embodiment, first and/or second optically curable materials 402, 502 are cured immediately as a result of being irradiated with ultraviolet radiation 504. More particularly, first and/or second optically curable materials 402, 502 are entirely cured while being irradiated with ultraviolet radiation 504.

In an alternative embodiment, first and/or second optically curable materials 402, 502 are optically activated materials. In accordance with this embodiment, first and/or second optically curable materials 402, 502 cure over a period of time as a result of being irradiated with ultraviolet radiation 504. More particularly, first and/or second optically curable materials 402, 502 cure initiate while being irradiated with ultraviolet radiation 504 and then entirely cure over a period of time without further irradiation.

In one embodiment, after being cure initiated, first and/or second optically curable materials 402, 502 entirely cure at room temperature, i.e., without heating. Illustratively, first and/or second optically curable materials 402, 502 are substantially cured in a few seconds during the cure initiate, i.e., while being irradiated with ultraviolet radiation 504. After being irradiated with ultraviolet radiation 504, first and/or second optically curable materials 402, 502 finish curing, sometime called entirely cure, at room temperature, e.g., over a period of 120 minutes or more.

In an alternative embodiment, after being cure initiated, first and/or second optically curable materials 402, 502 are heated to finish curing, e.g., to reduce the curing time.

Advantageously, first and second optically curable materials 402, 502 are cured rapidly, e.g., in one to ten seconds. This is in stark contrast to conventional thermally curable materials, which often had a cure time of one to two hours. By curing first and second optically curable materials 402, 502 rapidly, the time required to fabricate image sensor package 100 is minimized. This, in turn, minimizes the fabrication cost of image sensor package 100.

In one embodiment, first and second optically curable materials 402, 502 are cured without heating. This is in stark contrast to conventional thermally curable materials, which required heating for several hours.

Accordingly, use of first and second optically curable materials 402, 502 is well suited for applications in which it is important to keep image sensor 108 and any other temperature sensitive components of image sensor package 100 at low temperature, for example, to prevent degradation or damage to any color filters and/or other temperature sensitive materials of image sensor 108.

Further, since first and second optically curable materials 402, 502 are cured without heating, the requirement for cure ovens, which were necessary to cure conventional thermally curable materials, is eliminated further minimizing the fabrication cost of image sensor package 100.

In one embodiment, instead of forming interconnection balls 126 prior to mounting of image sensor 108 to substrate 102, interconnection balls 126 are formed after first optically curable material 402 and second optically curable material 502 are cured.

Figure 6:
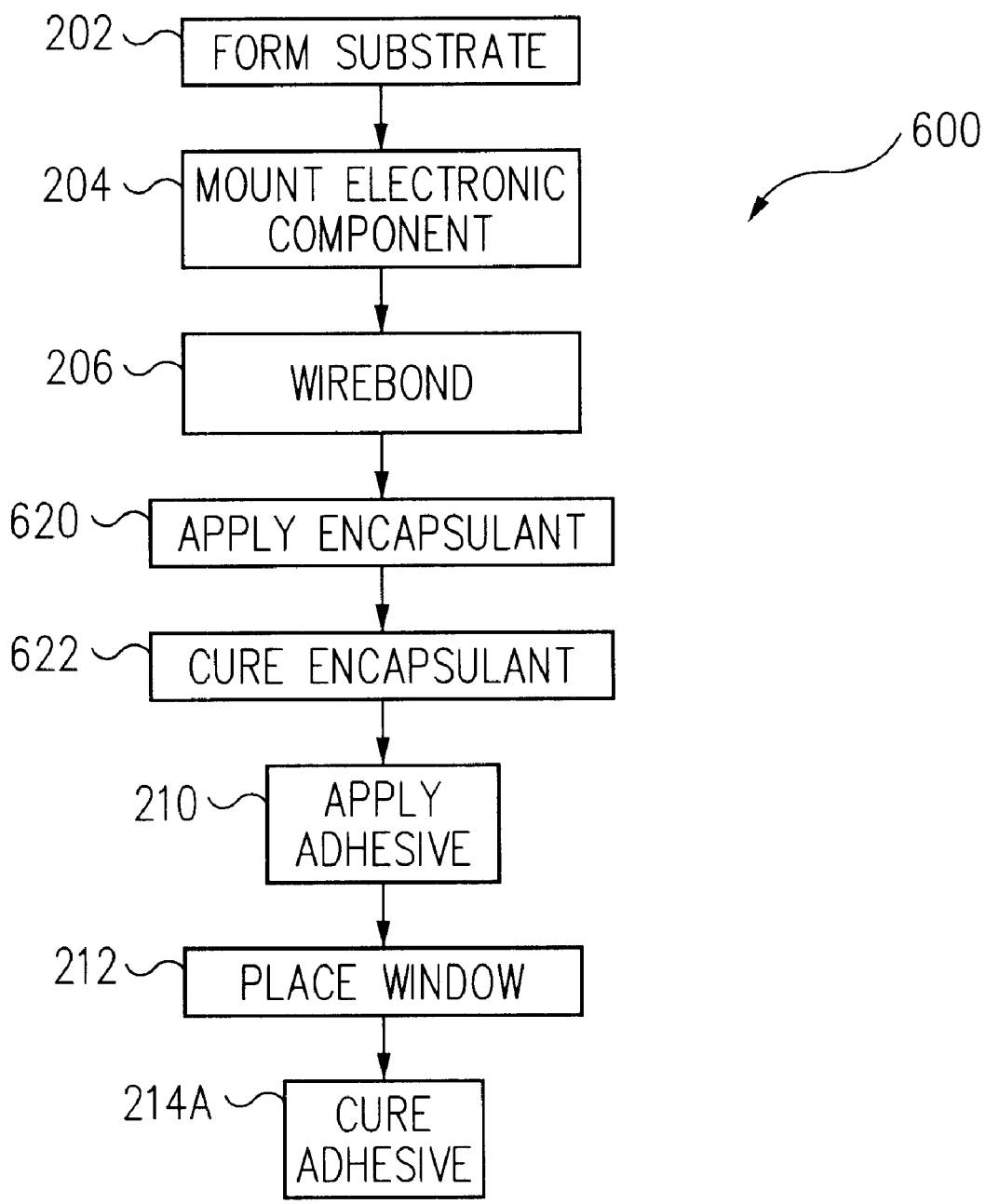
FIG. 6 is a block diagram illustrating operations in a process for manufacturing the image sensor package of FIG. 1 in accordance with another embodiment of the present invention.

FIG. 6 is a block diagram 600 illustrating operations in a process for manufacturing image sensor package 100 of FIG. 1 in accordance with another embodiment of the present invention. Block diagram 600 of FIG. 6 is similar to block diagram 200 of FIG. 2 and only the significant differences are discussed below.

Referring now to FIGS. 4 and 6 together, in an Apply Encapsulant Operation 620, a thermally curable material 402 is applied to cover bond pads 114, bond wires 118 and at least a portion of interior traces 116. Thermally curable material 402 is applied, for example, with a needle dispenser. In a Cure Encapsulant Operation 622, image sensor package 100 is heated to cure thermally curable material 402 to form encapsulant 119 (FIG. 1).

Apply Adhesive Operation 210 and Place Window Operation 212 of FIG. 6 are similar or identical to Apply Adhesive Operation 210 and Place Window Operation 212 of FIG. 2 and so are not discussed further to avoid detracting from the principles of the invention.

Referring now to FIGS. 5 and 6 together, in a Cure Adhesive Operation 214A, second optically curable material 502 is cured through lid 130 with ultraviolet radiation 504 in a manner similar to that described above in Cure Operation 214 of FIG. 2.

Figure 7:
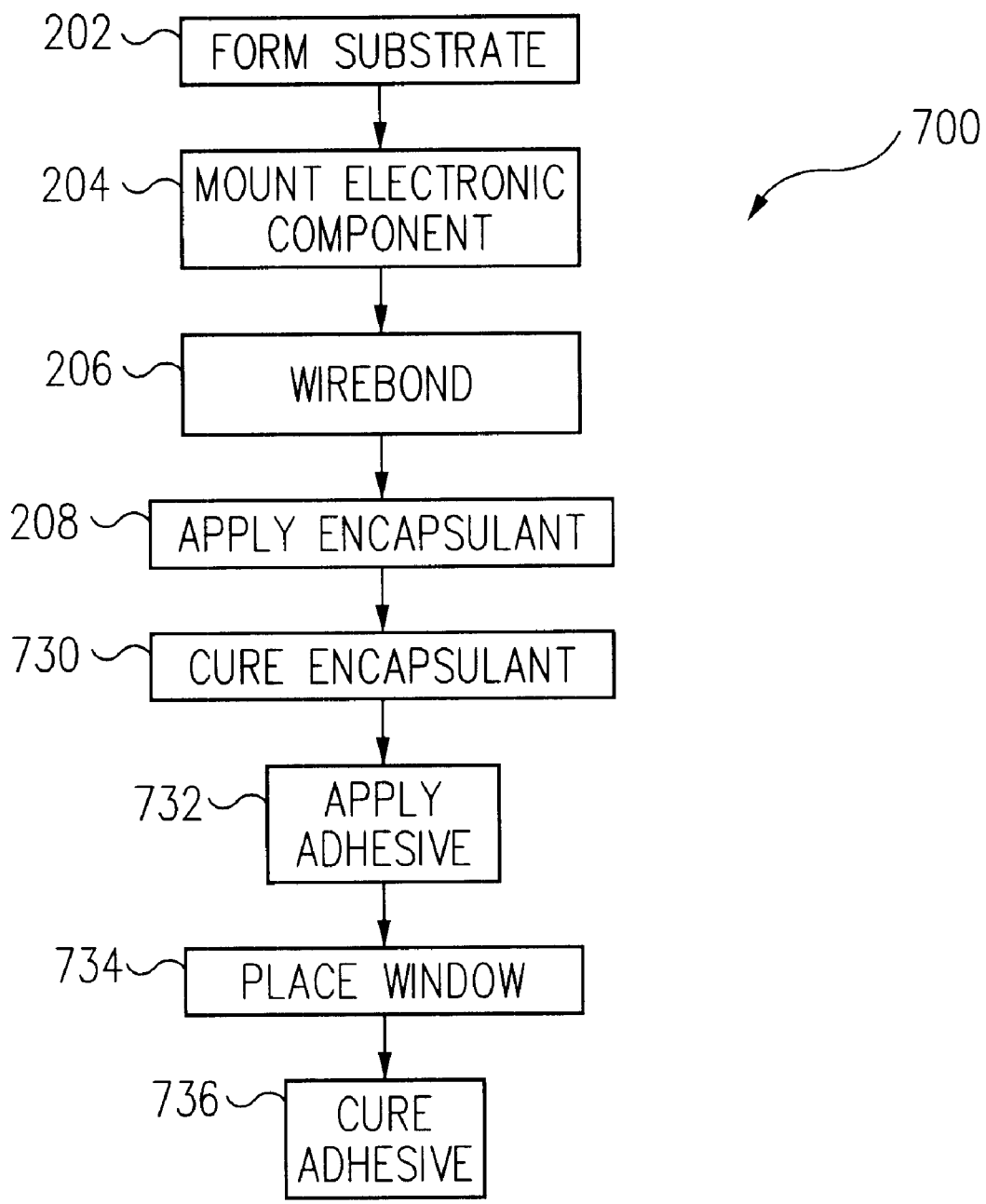
FIG. 7 is a block diagram illustrating operations in a process for manufacturing the image sensor package of FIG. 1 in accordance with yet another embodiment of the present invention.

FIG. 7 is a block diagram 700 illustrating operations in a process for manufacturing image sensor package 100 of FIG. 1 in accordance with yet another embodiment of the present invention. Block diagram 700 of FIG. 7 is similar to block diagram 200 of FIG. 2 and only the significant differences are discussed below.

Referring now to FIGS. 4 and 7 together, in a Cure Encapsulant Operation 730, first optically curable material 402 is cured with ultraviolet radiation (not shown) to form encapsulant 119 (FIG. 1) in a manner similar to that described above in Cure Operation 214 of FIG. 2.

Referring now to FIGS. 5 and 7 together, in an Apply Adhesive Operation 732, a thermally curable material 502 is applied to lid mounting surface 128 of substrate 102 or, alternatively, to the periphery of interior surface 130I of lid 130.

In a Place Window Operation 734, lid 130 is aligned with substrate 102, e.g., with a mechanical or optical alignment system. More particularly, the periphery of interior surface 130I of lid 130 is aligned with lid mounting surface 128. Lid 130 is moved downwards to place lid 130 on substrate 102 such that thermally curable material 502 is squeezed between substrate 102 and lid 130. As a result, thermally curable material 502 is applied between lid 130 and substrate 102.

In a Cure Adhesive Operation 736, image sensor package 100 is heated to cure thermally curable material 502 to form lid adhesive 132 (FIG. 1).

Cure Encapsulant Operation 730 is described above as occurring before Place Window Operation 734 and before Cure Adhesive Operation 736. However, in one alternative embodiment, Cure Encapsulant Operation 730 is performed after Place Window Operation 734 and before Cure Adhesive Operation 736. In another alternative embodiment, Cure Encapsulant Operation 730 is performed after Place Window Operation 734 and after Cure Adhesive Operation 736.

This application is related to Hoffman, co-filed and commonly assigned U.S. patent application Ser. No. 09/946,861, entitled "QUICK SEALING GLASS-LIDDED PACKAGE FABRICATION METHOD", which is herein incorporated by reference in its entirety.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. An electronic component package comprising:
   a substrate;
   an electronic component coupled to said substrate, said electronic component comprising a bond pad and an active area responsive to electromagnetic radiation;
   an interior trace coupled to said substrate;
   a bond wire electrically coupling said bond pad to said interior trace;
   an encapsulant enclosing said bond wire, said encapsulant comprising a first optically curable material that has been cured, wherein said encapsulant leaves exposed said active area;
   a lid; and
   a lid adhesive coupling said lid to said substrate, said lid adhesive comprising a second optically curable material that has been cured.

2. The electronic component package of claim 1 wherein said substrate comprises a base and a sidewall, said electronic component being coupled to said base.

3. The electronic component package of claim 2 wherein said sidewall comprises a lid mounting surface, said lid adhesive coupling said lid to said lid mounting surface.

4. The electronic component package of claim 1 wherein said lid is transparent to said electromagnetic radiation.

5. The electronic component package of claim 4 wherein said lid comprises glass.

6. The electronic component package of claim 1 wherein said first optically curable material comprises ultraviolet radiation (UV) curable material.

7. The electronic component package of claim 1 wherein said first optically curable material comprises a viscous material that cures as a result of being irradiated with ultraviolet radiation.

8. The electronic component package of claim 7 wherein said lid is transparent to said ultraviolet radiation.

9. The electronic component package of claim 1 wherein said first optically curable material is selected from the group consisting of an optically entirely curable material and an optically activated material.

10. The electronic component package of claim 1 wherein said second optically curable material comprises ultraviolet radiation (UV) curable material.

11. The electronic component package of claim 1 wherein said second optically curable material comprises a viscous material that cures as a result of being irradiated with ultraviolet radiation.

12. The electronic component package of claim 11 wherein said lid is transparent to said ultraviolet radiation.

13. The electronic component package of claim 1 wherein said second optically curable material is selected from the group consisting of an optically entirely curable material and an optically activated material.

14. The electronic component package of claim 1 wherein said interior trace is coupled to a first surface of said substrate, said electronic component package further comprising an exterior trace coupled to a second surface of said substrate, said exterior trace being electrically coupled to said interior trace.

15. The electronic component package of claim 14 further comprising a pad coupled to said exterior trace.

16. The electronic component package of claim 14 further comprising an interconnection ball coupled to said exterior trace.

17. An electronic component package comprising:
a substrate comprising a base and a sidewall, said sidewall comprising a lid mounting surface, wherein said lid mounting surface is annular;
an electronic component coupled to said base of said substrate, said electronic component comprising a bond pad;
an interior trace coupled to said substrate;
a bond wire electrically coupling said bond pad to said interior trace;
an encapsulant enclosing said bond wire, said encapsulant comprising a first optically curable material that has been cured;
a lid; and
a lid adhesive coupling said lid to said lid mounting surface, said lid adhesive comprising a second optically curable material that has been cured.

18. The electronic component package of claim 17 wherein said lid adhesive bonds a periphery of a first surface of said lid to said lid mounting surface.

19. An electronic component package comprising:
a substrate;
an electronic component coupled to said substrate, said electronic component comprising a bond pad;
an interior trace coupled to said substrate;
a bond wire electrically coupling said bond pad to said interior trace;
an encapsulant enclosing said bond wire, said encapsulant comprising a first optically curable material that has been cured;
a lid; and
a lid adhesive coupling said lid to said substrate, said lid adhesive comprising a second optically curable material that has been cured, wherein said substrate, said lid, and said lid adhesive form an enclosure around said electronic component.

20. An electronic component package comprising:
a substrate;
an electronic component coupled to said substrate, wherein said electronic component comprises a bond pad;
a lid;
a lid adhesive coupling said lid to said substrate, said lid adhesive comprising a first optically curable material that has been cured, wherein said substrate, said lid, and said lid adhesive form an enclosure around said electronic component;
an interior trace coupled to said substrate;
a bond wire electrically coupling said bond pad to said interior trace; and
an encapsulant enclosing said bond wire, wherein said encapsulant comprises a second optically curable material that has been cured.

21. The electronic component package of claim 20 wherein said substrate comprises a lid mounting surface, said lid adhesive coupling said lid to said lid mounting surface.

22. The electronic component package of claim 21 wherein said lid mounting surface is annular.

23. The electronic component package of claim 22 wherein said lid adhesive bonds a periphery of a first surface of said lid to said lid mounting surface.

24. The electronic component package of claim 20 wherein said electronic component further comprises an active area responsive to electromagnetic radiation.

25. The electronic component package of claim 24 wherein said lid is transparent to said electromagnetic radiation.

26. The electronic component package of claim 25 wherein said lid comprises glass.

27. The electronic component package of claim 20 wherein said first optically curable material comprises ultraviolet radiation (UV) curable material.

28. The electronic component package of claim 20 wherein said first optically curable material comprises a viscous material that cures as a result of being irradiated with ultraviolet radiation.

29. The electronic component package of claim 28 wherein said lid is transparent to said ultraviolet radiation.

30. An electronic component package comprising:
a substrate;
an electronic component coupled to said substrate, said electronic component comprising a bond pad and an active area responsive to electromagnetic radiation;
an interior trace coupled to said substrate;
a bond wire electrically coupling said bond pad to said interior trace;
an encapsulant enclosing said bond wire, said encapsulant comprising a first optically curable material that has been cured, wherein said encapsulant leaves exposed said active area;
a lid; and
a lid adhesive coupling said lid to said substrate, wherein said lid adhesive comprises a second optically curable material that has been cured.

31. An electronic component package comprising:

a substrate;

an electronic component coupled to said substrate, wherein said electronic component comprises a bond pad;

a lid;

a means for coupling said lid to said substrate, said means for coupling comprising a first optically curable material that has been cured, wherein said substrate, said lid, and said means for coupling form an enclosure around said electronic component;

an interior trace coupled to said substrate;

a bond wire electrically coupling said bond pad to said interior trace; and a means for protecting said bond wire, wherein said means for protecting said bond wire comprises a second optically curable material that has been cured.

* * * * *